United States Patent [19]

McClellan et al.

[11] Patent Number: 5,612,648

[45] Date of Patent: Mar. 18, 1997

[54] TRANSCONDUCTANCE-CAPACITANCE FILTER WITH EXTENDED CONTROL RANGE

[75] Inventors: Kelly P. McClellan, Irvine; Parameswaran K. Gopalier, Rancho Santa Margarita; Khosrow H. Sadeghi, Irvine, all of Calif.

[73] Assignee: Standard Microsystems Corporation, Hauppauge, N.Y.

[21] Appl. No.: 403,931

[22] Filed: Mar. 14, 1995

[51] Int. Cl.⁶ .............................. H03F 3/45; H03F 3/191
[52] U.S. Cl. .......................... 330/253; 330/303; 327/563
[58] Field of Search .................................. 330/253, 282, 330/283, 300, 306, 303; 327/563

[56] References Cited

U.S. PATENT DOCUMENTS

| | | | |
|---|---|---|---|
| 5,206,889 | 4/1993 | Unkrich | 377/20 |
| 5,227,681 | 7/1993 | Koyama et al. | 330/300 X |
| 5,541,538 | 7/1996 | Bacrania et al. | 327/563 X |

OTHER PUBLICATIONS

Tsividis, "Integrated Continuous–Time Filer Design An Overview", IEEE Journal of Solid State Circuits, vol. 29, No. 3, Mar. 1994.

Schaumann et al., "Design of Analog Filters", Prentice Hall, Englewood Cliffs, N.J., pp. 457–485.

Primary Examiner—Steven Mottola
Attorney, Agent, or Firm—Meltzer, Lippe, Goldstein, et al.

[57] ABSTRACT

A $G_m$-C filter is formed using transconductor elements having first and second degeneration FETs to which first and second control signals are applied. A phase-locked-loop is used to generate the control signals. The control range of the transconductor elements is increased so that the frequency response of the filter can be maintained over increased ranges of various parameters (e.g., supply voltage variations, temperature variations, etc.)

7 Claims, 3 Drawing Sheets

TRANSCONDUCTANCE-CAPACITANCE FILTER WITH EXTENDED CONTROL RANGE

FIELD OF THE INVENTION

The present invention relates to continuous time (CT) filters. Specifically, the present invention relates to a type of CT filter known as a transconductancecapacitance ($G_m$-C) filter. In accordance with the invention, modified FET transconductor elements and a feedback loop are utilized to increase the control range of the transconductor elements and provide a desired frequency response for the filter.

BACKGROUND OF THE INVENTION

CT filters are used in a variety of direct signal processing applications where high speed and/or low power dissipation are needed. An example of an appropriate application of CT filters in direct signal processing is the read channel of a disk drive whose requirements for speed and power are such that CT filters are preferred. Other applications for CT filters include receivers, which receive data from local area networks or high speed data links, and wireless communication systems.

One type of CT filter is known as a $G_m$-C filter. Such filters are discussed in detail in Tsividis "Integrated Continuous-Time Filter Design: an Overview" IEEE Journal of Solid State Circuits, Vol. 29, No. 3, March 1994, and Schaumann et al. "Design of Analog Filters" Prentice Hall, Englewood Cliffs, N.J., pp 457–485, the contents of which are incorporated herein by reference. The basic building block of a $G_m$-C filter is a transconductance amplifier comprising a transconductor element and a capacitor or a pair of capacitors. A transconductor is an element whose output current is linearly related to an input voltage by a transconductance $G_m$. For example, $I_o = G_m \cdot 2V_i$, where $I_o$ is the output current and $V_i$ is the input voltage.

An example of a transconductance amplifier integrator 10 is shown in FIG. 1. The amplifier integrator 10 of FIG. 1 comprises the transconductor 12 and the capacitor 14. As indicated above, the output current of the transconductor $I_o$ is equal to $G_m \cdot 2V_i$. The output voltage $V_o$ is given by $V_o = V_i G_m/sC$ where C is the capacitance of the capacitor 14 and s is the complex frequency.

The frequency response of the transconductance amplifier integrator 10 is determined by the control voltage $V_c$ which is received as an input 13 in the transconductor 12. The control voltage is used to compensate for transconductor and capacitor variations (e.g., power supply variations, temperature variations, and integrated circuit process parameter variations). These variations are common in FET integrated circuits used to implement $G_m$-C filters.

A transconductor 12 implemented using FETs is shown in FIG. 2. The transconductor 12 comprises two legs 21 and 23. The two legs 21 and 23 have fixed equal current sources 22 and 24. The input voltages $+V_i$ and $-V_i$ are applied to the gates of the FETs 26 and 28. The control voltage $V_c$ is applied to the degeneration FET 30. The voltage $V_Q$ is a quiescent voltage. The output current $I_o$ flows in the two FETs 26 and 28 in opposite directions.

An integrated circuit $G_m$-C filter implemented using a plurality of transconductance amplifiers is shown in FIG. 3. The filter 40 of FIG. 3 comprises four transconductors 42, 44, 46, 48 and two capacitors 47 and 49. The filter 40 has a low pass output $V_{LP}$ and a bandpass output $V_{BP}$.

Typically, the control voltage $V_c$ for the transconductors in a $G_m$-C filter is generated by a phase-locked-loop (PLL). A circuit 60 in which an exemplary phase-locked-loop is used to generate the control voltage $V_c$ is shown in FIG. 4. As shown in FIG. 4, the control voltage for the $G_m$-C filter 40 is generated using the PLL 50. The PLL 50 comprises a phase comparator 52 which receives an external reference signal such as a signal 51 from a crystal oscillator (not shown) and a signal 53 from a voltage-controlled-oscillator (VCO) 54. The phase comparator 52 outputs a frequency incrementing signal FUP and a frequency decrementing signal FDN to a charge pump 56. The FUP signal is generated when the VCO output signal lags the crystal oscillator signal. The FDN signal is generated when the VCO output signal leads the crystal oscillator signal.

Depending on which of the FUP or FDN signals is applied, the charge pump 56 will generate positive or negative current pulses which add to or subtract from the total charge accumulated in a charge accumulating device (e.g. capacitor) 58. The device 58 generates a voltage $V_c$ which is dependent on the total charge in the accumulating device 58. This voltage $V_c$ is the input voltage to the VCO 54. If $V_c$ increases or decreases, the output frequency of the VCO increases or decreases. The voltage $V_c$ also serves as the control voltage for the transconductors in the $G_m$-C filter 40 and is used to compensate the transconductors for a variety of parameter variations. Phase-locked-loops of the type described above are disclosed in U.S. Pat. No. 5,126,692 the contents of which are incorporated herein by reference. It should be noted that the VCO 54 may implemented by a voltage-to-current convertor and a current controlled oscillator (ICO).

In general, the VCO 54 is made using the same basic transconductor and capacitor elements as the $G_m$-C filter 40. The same quantity $V_c$ used to control these elements in the VCO 54 is used to control the corresponding elements in the main $G_m$-C filter 40.

However, the above described technique for controlling a $G_m$-C filter 40 is limited by the effective control range of the transconductor elements. If the control range is not sufficient, then the gain of the transconductors ($I_o/V_i$) cannot be changed enough to account for all of the possible parameter variations and the filter frequency response will not be correct.

Accordingly, it is an object of the invention to increase the control range of the transconductor elements of a $G_m$-C filter. This makes it possible to maintain the filter frequency response over an increased range of transconductor and capacitor variations.

SUMMARY OF THE INVENTION

In accordance with a preferred embodiment of the invention, the control range of a tranconductor element is increased by adding a second degeneration FET. The $G_m$-C filters may then be formed using transconductors with a second degeneration FET. A control signal is provided for the second degeneration FET of the transconductor elements in the $G_m$-C filter by processing the VCO input signal $V_c$ in a signal processing path. The control signal for the second degeneration FET is also fed back to the VCO to control the corresponding transconductor elements in the VCO.

3

Figure 1:
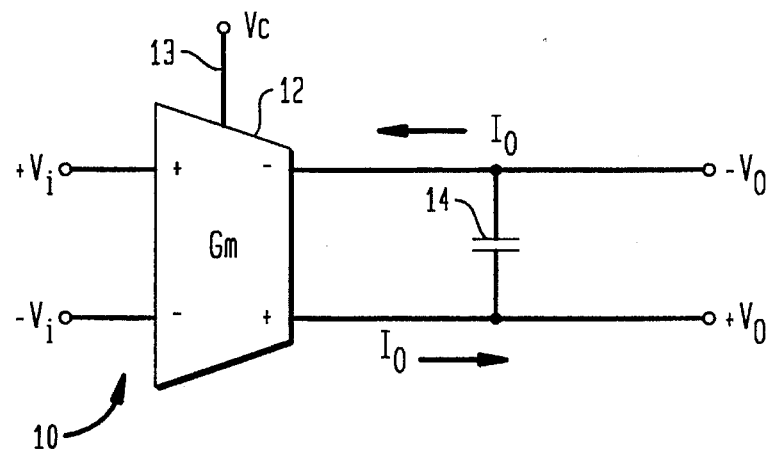
FIG. 1 schematically illustrates a conventional transconductance amplifier.
Figure 2:
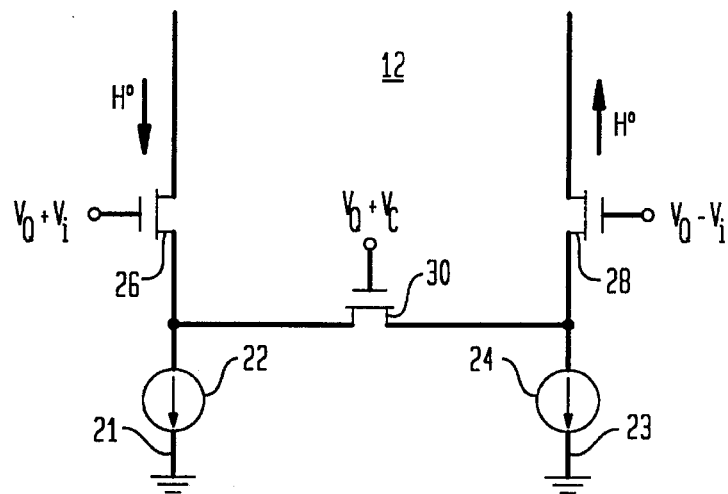

FIG. 2 is a circuit diagram of conventional transconductor element.

Figure 3:
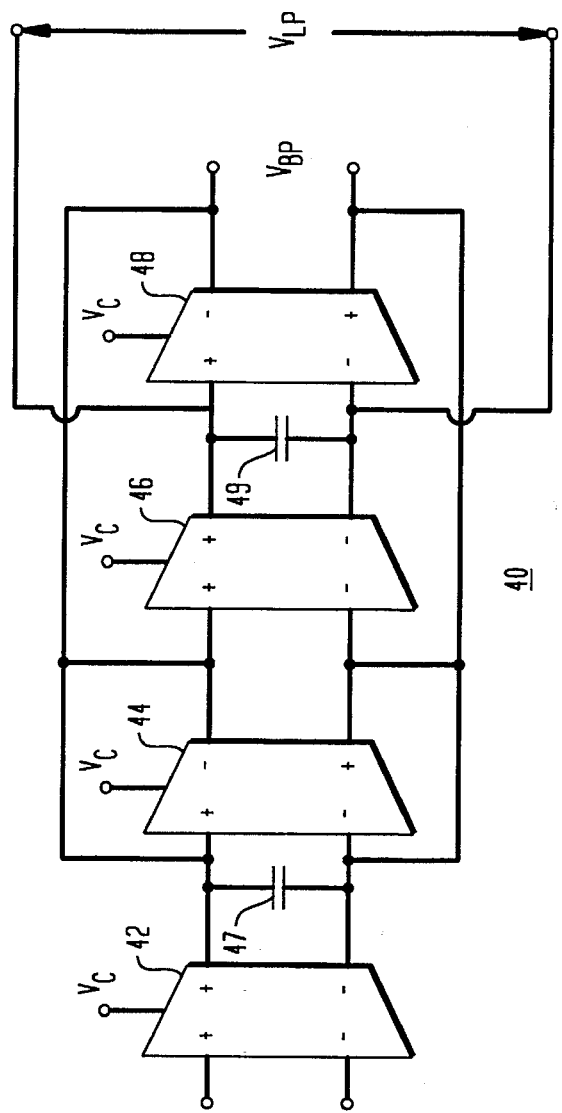

FIG. 3 schematically illustrates a conventional $G_m$-C filter formed from transconductance amplifiers.

Figure 4:
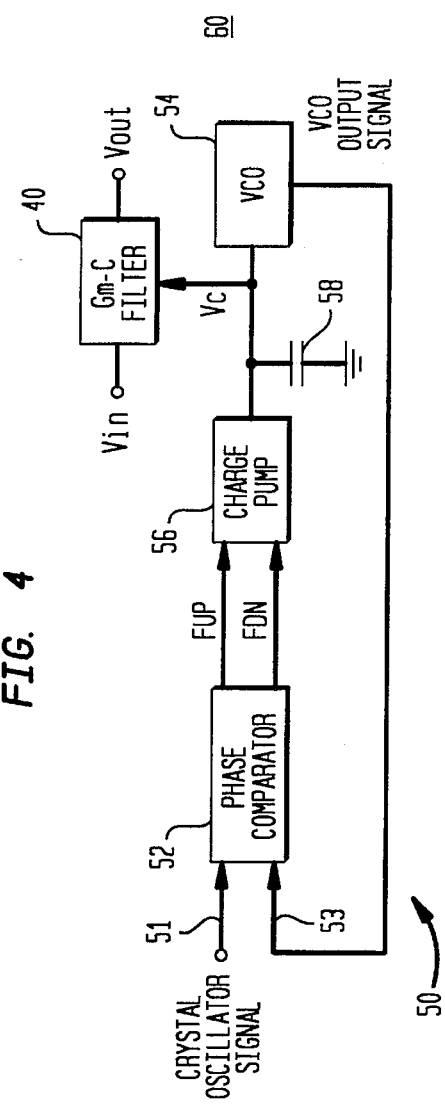

FIG. 4 illustrates the use of a PLL to control a $G_m$-C filter.

Figure 5:
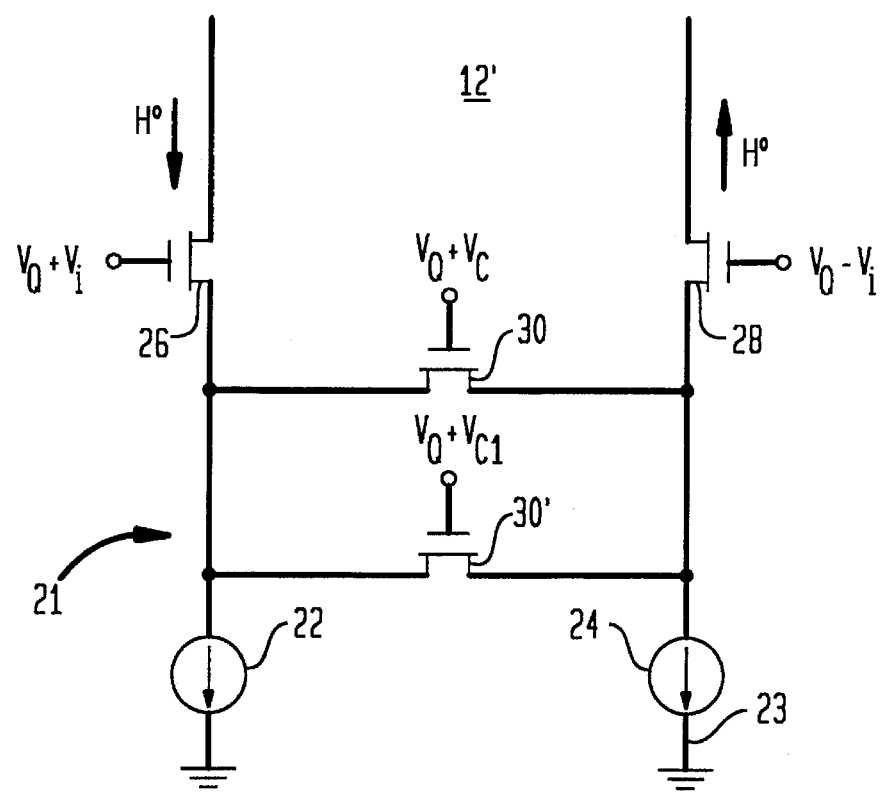

FIG. 5 illustrates a transconductor with two degeneration FETs, in accordance with an illustrative embodiment of the invention.

Figure 6:
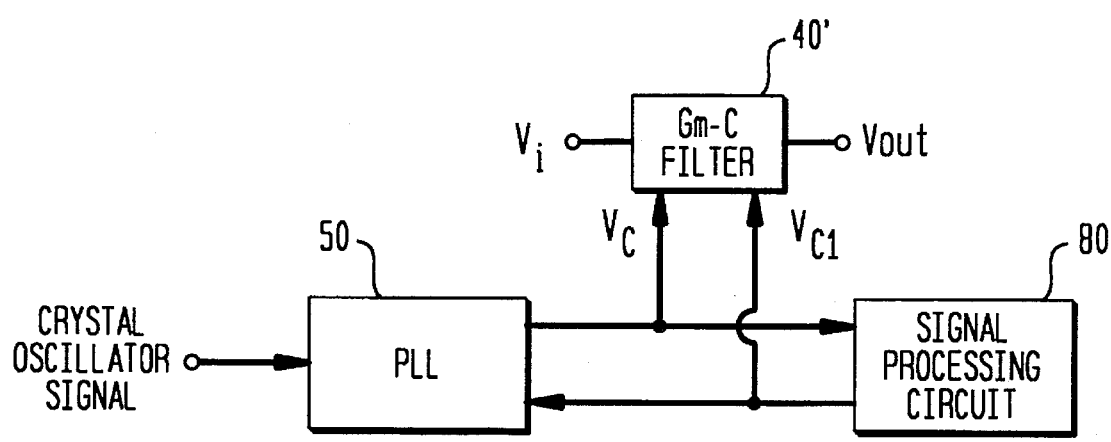

FIG. 6 illustrates how to use a PLL to generate control signals for the two degeneration FETs in each transconductor element in a $G_m$-C filter, in accordance with an illustrative embodiment of the invention.

Figure 7:
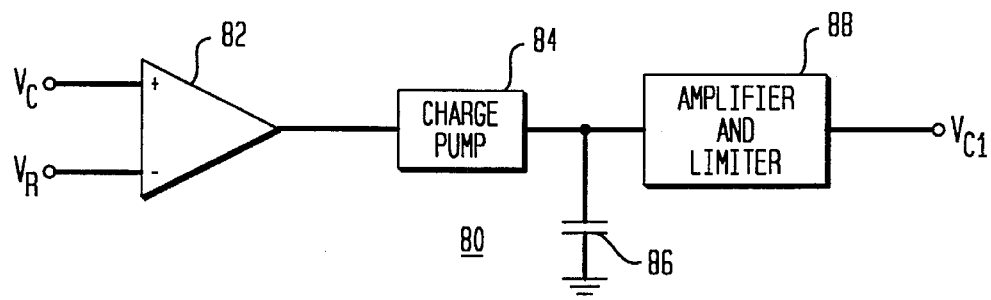

FIG. 7 illustrates the signal processing path used to process a VCO input signal to generate the control signal for the second degeneration FET in a transconductor, in accordance with an illustrative embodiment of the invention.

DETAILED DESCRIPTION OF THE INVENTION

In accordance with the present invention, $G_m$-C filters are formed using transconductors with two degeneration FETs rather than one degeneration FET as is the case in the prior art. A transconductor with two degeneration FETs is shown in FIG. 5.

Like the conventional transconductor 12 of FIG. 2, the inventive transconductor 12' of FIG. 5 comprises two legs 21 and 23. The two legs 21 and 23 have equal fixed current sources 22 and 24 and the FETs 26 and 28. The positive input voltage $+V_i$ is applied to the gate of the FET 26. The negative input voltage $-V_i$ is applied to the gate of the FET 28. (As indicated above, $V_Q$ is a quiescent voltage). A negative output current $I_o$ flows in the FET 26 and positive output current of the same magnitude flows in the FET 28. A first degeneration FET 30 is connected between the two legs 21 and 23. A control voltage $V_c$ is applied to the gate of the degeneration FET 30. As indicated above in connection with FIG. 4, the control voltage $V_c$ is the input voltage to a VCO in a PLL.

In accordance with the invention, a second degeneration FET 30' is connected between the legs 21 and 23. A control voltage $V_{c1}$ is applied to the gate of the FET 30'.

The control voltage $V_{c1}$ is generated from the voltage $V_c$ using a signal processing path. FIG. 6 illustrates a circuit for controlling a $G_m$-C filter made from transconductors of the type shown in FIG. 5. As shown in FIG. 6, a $G_m$-C filter 40' is controlled by a phase-locked-loop 50. The $G_m$-C filter 40' is comprised of transconductors and capacitors (see FIG. 3) with each transconductor having two degeneration FETs (rather than one). Thus, each transconductor has two control voltages, $V_c$ for the first degeneration FET and $V_{c1}$ for the second degeneration FET. The PLL 50 is illustrated in greater detail in FIG. 4 and is discussed in detail above. The voltage $V_c$ is the input voltage to the VCO in the PLL 50. The voltage $V_{c1}$ is generated by the signal processing circuit 80. The voltage $V_{c1}$ is applied to the main $G_m$-C filter 40'. As indicated above, the VCO in the PLL contains transconductor and capacitor elements corresponding to those in the $G_m$-C filter 40'. Thus, the voltage $V_{c1}$ is fed back to the PLL 50 to control the second degeneration FET 30' in the transconductor elements therein.

The signal processing circuit 80 is shown in greater detail in FIG. 7. The signal processing circuit 80 comprises a comparator 82, a charge pump 84, a capacitor 86, and amplifier/limiter 88. The comparator compares the voltage

4

$V_c$ with a reference voltage $V_R$. When $V_c$ exceeds $V_R$, the charge pump 84 generates a current which is applied to a capacitor 86 to slowly increase the voltage of the capacitor 86. When $V_c$ is less than $V_R$, the charge pump 84 generates a negative current which is applied to the capacitor 86 to decrease its voltage. The voltage of the capacitor 86 is applied to an amplifier/limiter 88 to generate the control voltage $V_{c1}$.

The bandwidth of the feedback path containing the signal processing circuit 80 is set to be lower than the PLL bandwidth to avoid interaction and PLL instability. The combination of the feedback path and the second degeneration FET act to limit the low frequency component of $V_c$ to be less than $V_R$.

It should also be noted that the second degeneration FET increases the gain ($I_o/V_i$) of the transconductor when its gate voltage is increased and allows the first degeneration FET to operate at a lower gate voltage.

In short, a $G_m$-C filter is formed using transconductor elements with two degeneration FETs. The filter is compensated by applying a PLL output voltage to the first degeneration FET in each transconductor and by applying to the second degeneration FET a control voltage generated by processing the PLL output voltage in a signal processing circuit.

Finally, the above-described embodiments of the invention are intended to be illustrative only. Numerous alternative embodiments may be devised by those skilled in the art without departing from the spirit and scope of the following claims.

We claim:

1. A transconductor element comprising a first circuit leg comprising a first fixed current source and a first FET for receiving a positive input voltage, a second circuit leg comprising a second fixed current source and a second FET for receiving a negative input voltage, a first degeneration FET connected between said first and second legs for receiving a first control voltage, a second degeneration FET connected between said first and second legs for receiving a second control voltage wherein:

said transconductor is connected to a phase-locked-loop containing a voltage-controlled-oscillator, said first control voltage is an input voltage of said voltage-controlled-oscillator, and said second control voltage is generated by a signal processing circuit from said first control voltage and is fed back to said voltage-controlled-oscillator.

2. The transconductor of claim 1 wherein said signal processing circuit comprises:

a comparator for comparing said first control voltage to a reference voltage, a charge pump enabled by said comparator for generating a current, an accumulator for accumulating charges associated with the current of said charge pump and for generating a voltage indicative of the accumulated charge, and an amplifier responsive to said voltage indicative of said accumulator charge for outputting said second control voltage.

3. In combination, a $G_m$-C filter comprising a plurality of transconductors, each of said transconductors including first and second degeneration FETs to which first and second control signals are applied, a phase-locked-loop having a voltage controlled oscillator and a circuit for generating an input signal of said voltage controlled oscillator in response to a phase difference between an output signal of said voltage controlled oscillator and a reference signal, said input signal of said voltage controlled oscillator serving as said first control signal, and a circuit for generating said second control signal from said first control signal, said second control signal being fed back to said voltage controlled oscillator.

4. The combination of claim 3 wherein said circuit for generating said second control signal comprises:

a comparator for comparing said first control signal to a reference signal, a charge pump enabled by said comparator for generating a current, an accumulator for accumulating charges associated with the current of said charge pump and for generating a signal indicative of the accumulated charge, and and amplifier responsive to said signal indicative of the accumulated charge for outputting said second control signal.

5. A transconductor element having an extended effective control range comprising:

a first circuit leg comprising a first fixed current source and a first amplifier FET having first gate, source and drain, said first gate receiving a positive input voltage, a second circuit leg comprising a second fixed current source and a second amplifier FET having second gate, source and drain, said second gate receiving a negative input voltage, a first degeneration FET having third gate, source and drain, said third source being connected to said first source of said first amplifier FET and said third drain being connected to said second source of said second amplifier FET, said third gate receiving a first control voltage generated independently of said positive and negative input voltages, and a second degeneration FET having fourth gate, source and drain, said fourth source being connected to said first source of said first amplifier FET, said fourth drain being connected to said second source of said second amplifier FET, said fourth gate receiving a second control voltage distinct from said first control voltage and generated independently of said positive and negative input voltages.

6. The transconductor element of claim 5 wherein said second control voltage is derived from the first control voltage.

7. In combination, a $G_m$-C filter comprising a plurality of transconductors, each transconductor having an extended effective control range and comprising first and second degeneration FETs to which first and second control voltages are applied, respectively, said first and second degeneration FETs being in parallel with each other, such that the source and drain of the first degeneration FET is connected to the source and drain of the second degeneration FET, wherein said source and drain are interchangeable, a first circuit for generating said first control voltage in response to an external reference signal, and a second circuit for generating said second control voltage in response to the first control voltage.

* * * * *